United States Patent
Oliva

(10) Patent No.: US 7,023,626 B1
(45) Date of Patent: Apr. 4, 2006

(54) OPTICAL DEVICE, LENS AND OPTICAL ELEMENT FOR FOCUSING A LASER BEAM AND APPARATUS AND METHOD FOR ASSEMBLING THE OPTICAL DEVICE

(75) Inventor: Guido Maurizio Oliva, Rovigo (IT)

(73) Assignee: DATALOGIC S.p.A., Bologna (IT)

( * ) Notice: Subject to any disclaimer, the term of this patent is extended or adjusted under 35 U.S.C. 154(b) by 0 days.

(21) Appl. No.: 09/497,552

(22) Filed: Feb. 3, 2000

(30) Foreign Application Priority Data

Oct. 26, 1999 (EP) .................................. 99830677

(51) Int. Cl.
*G02B 17/00* (2006.01)

(52) U.S. Cl. ...................... 359/737; 359/707; 359/741; 359/742; 359/798; 359/800; 359/806; 359/808; 359/719; 372/101; 235/454; 235/455; 235/462.06

(58) Field of Classification Search ................ 359/707, 359/719, 737–739, 741, 742, 798, 800, 806, 359/808; 235/454, 455, 462.06; 372/101
See application file for complete search history.

(56) References Cited

U.S. PATENT DOCUMENTS

| | | | | |
|---|---|---|---|---|
| 3,764,198 A * | 10/1973 | Hunzinger | .................. | 359/710 |
| 4,309,605 A | 1/1982 | Okabe | ........................ | 250/239 |
| 5,111,476 A | 5/1992 | Hollenbeck et al. | ........ | 372/107 |
| 5,233,170 A * | 8/1993 | Metlitsky et al. | ...... | 235/462.35 |
| 5,283,802 A | 2/1994 | Hsiung | ........................ | 372/107 |
| 5,438,187 A | 8/1995 | Reddersen et al. | .... | 235/462.22 |
| 5,665,957 A | 9/1997 | Lee et al. | ................. | 369/53.23 |
| 5,717,194 A | 2/1998 | Forbes et al. | .......... | 235/462.32 |
| 5,734,514 A | 3/1998 | Han | ........................... | 359/819 |
| 5,751,679 A | 5/1998 | Yamakawa et al. | .... | 369/112.08 |
| 5,825,054 A | 10/1998 | Lee et al. | ...................... | 257/98 |
| 5,886,332 A | 3/1999 | Plesko | ................... | 235/472.01 |
| 5,905,751 A | 5/1999 | Huang et al. | ............... | 372/101 |
| 6,342,976 B1 * | 1/2002 | Nomura et al. | ............. | 359/722 |
| 6,356,398 B1 * | 3/2002 | Otsuki et al. | ............... | 359/739 |
| 2002/0050517 A1 * | 5/2002 | Oliva | ......................... | 235/454 |

FOREIGN PATENT DOCUMENTS

| | | |
|---|---|---|
| EP | 0 366 984 | 5/1990 |
| EP | 0 534 222 | 3/1993 |
| EP | 0 555 872 | 8/1993 |
| EP | 0 840 306 | 5/1998 |
| EP | 0 844 606 | 5/1998 |

\* cited by examiner

*Primary Examiner*—Evelyn A. Lester
(74) *Attorney, Agent, or Firm*—Nixon & Vanderhye, P.C.

(57) ABSTRACT

The invention relates to an optical device for focusing a laser beam, comprising a source of emission of a laser beam, for example a substantially elliptic and astigmatic laser beam, a focusing lens of the laser beam and first aperture adapted to select a central portion of the laser beam. The first aperture is directly applied on the focusing lens, and comprises a coating made of a substantially opaque material which are applied (for example, by spraying, sputtering, evaporation, printing, painting) on a peripheral portion of a front surface of the focusing lens so as to allow the propagation of the central portion of the laser beam and obstruct the propagation of a surrounding portion of beam. The device of the invention is extremely simple from the constructive point of view, and is inexpensive and small-sized.

37 Claims, 5 Drawing Sheets

OPTICAL DEVICE, LENS AND OPTICAL ELEMENT FOR FOCUSING A LASER BEAM AND APPARATUS AND METHOD FOR ASSEMBLING THE OPTICAL DEVICE

BACKGROUND OF THE INVENTION

1. Field of the Invention

The present invention relates to an optical device for focusing a laser beam, for example a substantially elliptic and astigmatic laser beam.

The invention also relates to a lens and to an optical element for focusing a laser beam emitted by a source of emission, in particular a laser diode. The invention also relates to an apparatus and a method for assembling the above device.

Preferably, but not exclusively, the device—or the lens, or the optical element—of the invention are adapted to be used on a small low-priced optical reader such as, for example, a portable reader of optical codes.

In this description and following claims, the term "optical reader" refers to any device adapted to acquire information relating to an object (for example, distance, volume, dimensions, or its identification data) through the acquisition and the processing of a luminous signal diffused by it, while the term "optical code" refers to a code (such as, for example, a bar code or a bidimensional code, or the like) adapted to univocally identify the objects on which it is provided.

By way of example and for the purpose of making the following description clearer, optical-code readers will be explicitly referred to.

2. Discussion of the Prior Art

An optical-code reader comprises, in its simplest embodiment, a source of emission of a luminous signal for illuminating an object, photodetecting means for collecting the luminous signal diffused by the illuminated object and generating an electric signal proportional to it, and computing means for processing and treating the generated electric signal so as to acquire the desired information. Usually, downstream of the source of emission is a focusing lens, adapted to focus the luminous signal emitted by the source of emission at a fixed distance.

As already known, particularly in small low-priced optical readers, there is the need of using inexpensive and small-sized focusing devices. For this purpose, the use of semiconductor laser diodes as source of emission is still widespread.

Nevertheless, although the use of a laser diode allows having advantages in terms of costs and overall dimensions of the reader, it presents the disadvantage of not allowing a reliable reading of optical codes having distances and inclinations very different from one another (this situation frequently occurs, for example, in handling systems for the distribution and sorting of objects that are identifiable by means of optical codes).

This disadvantage is essentially related to the fact that the laser beam emitted by a laser diode is divergent, with an elliptic and astigmatic profile; this causes the presence, in the focusing point, of a circular spot and, immediately before and after, an elliptic spot with the major axis of the ellipse that, downstream of the focusing point, is rotated by 90° with respect to its position upstream of the focusing point.

It is evident that such a type of beam shape is not adapted to carry out reliable readings of codes located at distances which are different with respect to the focusing one, except for a small interval.

The presence of an emission laser with elliptic profile can be particularly disadvantageous if the codes to be read are bar codes; to get a reliable reading, in this case the dimension of the spot in the direction of reading must be smaller than the minimum width among that of the narrower bar and of the narrower space; often, this is not possible with an elliptic-profile beam.

Thus, in order to overcome said disadvantages, laser-diode optical readers are equipped with further optical elements intended for controlling the dimensions of the laser beam in the focusing point and in its surroundings. In particular, these elements consist of a circular or rectangular (or any other suitable shape) aperture stop (or diaphragm) located into the optical device downstream of the focusing lens (or between the source of emission and the focusing lens), which is intended for introducing diffraction in the emission laser beam.

In fact, it is known that the passage of a luminous wave front through an aperture causes diffraction in the wave front; this means that all the internal points of the aperture and on its profile act as sources of spherical waves all in phase with one another. The diffraction pattern (spot) that can be seen at any distance from the aperture is the coherent sum of all these spherical waves. By combining the focusing effect of the laser beam caused by the use of the focusing lens, with the diffraction effect caused by the interposition of an aperture between the lens and the focal point (or between the source of emission and the lens), a spot is obtained in the focusing point and in its surroundings, the shape of which is the diffraction pattern corresponding to the aperture, scaled in its dimensions by a factor depending on the enlargement or reduction carried out by the lens.

Essentially, the main effect of the diffraction from one aperture is both that of increasing the dimensions of the laser beam in the focusing point with respect to those that it would have as a consequence of the simple geometrical convergence of the rays carried out by the focusing lens, and that of keeping the spot collimated and substantially with the same profile for a greater time interval, and finally, that of giving a more suitable shape to the spot for a possible reading of optical codes (in fact, by properly choosing the dimensions of the aperture, the reversal between major and minor axes of the ellipse before and after the focusing point vanishes). In this way, there is the advantage of increasing the reading field (depth of field) and of eliminating an excessive focusing of the spot, which would otherwise detect the imperfections of the support on which the code is printed.

Nevertheless, the introduction of a diaphragm of the above type into the optical device inevitably implies greater dimensions of the device itself; in addition, the relative positioning between diaphragm and focusing lens requires a special attention for the purpose of obtaining the desired effects of focusing and diffraction and of allowing a reliable reading. Additionally, since the type of diaphragm to be used (in particular, the aperture shape and dimension) is different on the various applications depending on the required efficiency, on the desired focusing distance, on the symmetry or asymmetry of the generated laser spot, etc., it is necessary to have a set of different diaphragms, each one being intended for a specific application; this implies an increase in the production and labour costs.

The technical problem at the basis of the present invention is that of providing an optical device for focusing a laser beam which on the one side should be constructively simple, of small dimensions and inexpensive, so as to be assembled inside low-priced and small-sized optical readers, and on the other side which should allow obtaining all the advantages resulting from the introduction of diffraction in the emission laser beam, thus overcoming at least some of the disadvantages described above with reference to the prior art.

SUMMARY OF THE INVENTION

Thus, in one aspect thereof, the present invention relates to an optical device for focusing a laser beam, comprising:
- a source of emission of a laser beam;
- a focusing lens of the laser beam;
- first means adapted to select a central portion of the laser beam;

characterised in that said first means are directly applied on the focusing lens.

Advantageously, therefore, the device of the present invention is provided with means adapted to introduce diffraction into the emission laser beam so as to control the profile of the spot for a great range of distances and obtain an increase in the depth of field of the laser beam. More advantageously, said means are directly applied on the focusing lens so as to allow a significant reduction in the overall dimensions of the focusing device and, thus, of the optical reader on which it is to be assembled. In addition, the device of the invention is especially simple from the constructive point of view, and it permits the use of widely used optical elements: this implies lower production costs.

The above advantages are especially evident when the laser beam is a substantially elliptic and astigmatic beam, although it is possible to obtain similar advantages also when using a circular-section laser beam. In fact, for a laser beam as the latter, the combined effect of focusing and diffraction produces, in the laser beam, a central portion having a greater collimation (and thus, a greater depth of field), and some side lobes which, although often undesired, do not prevent nor alter the reading of possible optical codes.

In the present description and following claims, the expression "central portion of the beam" refers to a circular portion whose diameter is greater than 0.5 mm and smaller than 2 mm, when the reader is intended for reading codes at any angle comprised between −45° and +45°, and a rectangular portion whose size ranges between 0.4 mm and 0.8 mm along the minor axis of the ellipse, and between 1.0 mm and 2.0 mm along the major axis of the ellipse, when the reader is intended for reading optical codes arranged in a substantially orthogonal direction with respect to the scan direction.

According to the present invention, the first means defines on the focusing lens an aperture having a Fresnel number which is smaller than 2 along a fixed reading direction; preferably, said aperture is smaller than 1.2 along the reading direction and smaller than 2 along an orthogonal direction with respect to said reading direction. In this way, it is possible to carry out reliable readings along all directions independently of the orientation of the code with respect to the reader.

As already known, the shape of the diffraction figure (spot) generated by an aperture is function of a parameter N, commonly known as Fresnel number, which is defined by the following relationship:

$$N = a^2/(\lambda \cdot Z)$$

wherein a is half the size of the aperture in the direction in which the diameter of the spot is measured, $\lambda$ is the wave length and Z is the effective distance of observation (in the case of a plane wave-front, Z is the actual distance of observation; in the case of a curved wave-front, the effective distance of observation differs from the actual distance of observation because of the bending radius of the wave-front). Thus, by properly choosing the Fresnel number, it is possible to choose each time the shape of the laser spot that allows obtaining a reliable reading.

According to a preferred embodiment of the device of the present invention, said first means comprises coating means made of a substantially opaque material, applied on a peripheral portion of a front surface of the focusing lens so as to allow the propagation of the central portion of the laser beam, and obstruct the propagation of a surrounding portion of beam. Advantageously, the provision of the different apertures, even when their shape is complex, is extremely simple, and it does not imply the construction or the use of special equipment.

In the present description and following claims, the term "opaque material" refers to a material through which luminous radiations cannot pass.

The coating means can be applied, alternatively, on the front surface of the focusing lens faced on the opposed side with respect to the source of emission (in the following description also referred to as "front face surface"), or on the front surface of the focusing lens faced on the same side of the source of emission (in the following description also referred to as "rear face surface). In fact, laboratory tests have proved that in both cases it is possible to introduce the desired effect of diffraction.

From the constructive point of view, it is preferable in any case to apply the coating means on the front face surface of the focusing lens. In fact, the application on the rear face surface would require a smaller aperture and thus, a greater precision in the operations for the laying of the coating means; this is due to the fact that, in correspondence with said rear surface, the laser beam expands and thus, its dimensions are smaller than those in correspondence with the front face surface.

Advantageously, said coating means are applied according to any one of the following methods: spraying, sputtering, evaporation, printing, painting, etc. The use or the construction of special equipment for making the aperture on the lens is thus not necessary, but only a suitable masking of the lens itself.

According to a first alternative embodiment of the device of the present invention, said first means comprises a diaphragm having a central aperture adapted to allow the propagation of the central portion of the laser beam, and a surrounding surface adapted to obstruct the propagation of a surrounding portion of beam, the lens and the diaphragm comprising opposed front surfaces, of conjugate shape, adapted to be reciprocally coupled. Preferably, in this case the device of the invention comprises an adhesive which is interposed between the diaphragm and the focusing lens for the purpose of allowing a perfect and stable coupling between the surface of the diaphragm and that of the lens.

According to a second alternative embodiment of the device of the present invention, the focusing lens and said first means form a single optical element comprising, in a first central portion, the focusing lens and, in a surrounding portion, means adapted to separate the central portion of the beam from the surrounding portion of beam. In this embodiment, the dimensions of the focusing lens, made for example by a diffractive technology, are equal to those of the desired aperture, so that the entire laser beam collected by the lens is focused.

Preferably, said means adapted to separate the central portion of the beam from the surrounding portion of beam comprise a surface made of a substantially opaque material, which is adapted to obstruct the propagation of the surrounding portion of beam.

Alternatively, said means adapted to separate the central portion of beam from the surrounding portion of beam comprises a surface made of a diffusing material, adapted to disperse the surrounding portion of beam. The simple use of a diffusing surface can cause the forming of a halo around the spot focused by the central portion of the optical element (which, in this embodiment, coincides with the focusing lens); for the purpose of obviating this problem, the surface of the diffusing material can advantageously be shaped according to any one of the following types of lens: divergent Fresnel lens, refracting lens, diffracting lens, so as to disperse as much as possible the incident light on the area not used for the reading.

In a preferred embodiment, the device of the present invention also comprises means for allowing the optical alignment between source of emission and focusing lens. Preferably, said means comprises a substantially tubular portion of lens which extends from a front surface of the focusing lens, and is adapted to be assembled by interference on a support structure of the source of emission, said substantially tubular portion comprising an inner wall provided with at least two teeth (preferably three) extending in a substantially radial direction and adapted to be housed into corresponding housings formed on the support structure of the source of emission. Advantageously, the alignment and the stable coupling between source of emission and focusing lens is obtained by inserting by pressure the support structure of the source of emission into the tubular portion of the lens without using any tensioning device. The fitting of the teeth into their respective housings contributes to ensuring the stability of the coupling.

For the purpose of ensuring a greater safety of the stable coupling between source of emission and focusing lens, the device of the invention also comprises an adhesive interposed between the support structure of the source of emission and the substantially tubular portion of the focusing lens. Preferably, said adhesive is a thermally conductive glue, so as to allow a better dissipation of the heat.

Preferably, the inner wall of the substantially tubular portion of the lens is coated with means made of a substantially opaque material. This allows minimising the risk of internal reflections before the laser beam passing through the aperture. Said reflections are undesirable because they cause the generation of secondary beams of internal reflection which, being refracted and focused by the lens in an unpredictable way, can cause the formation of halos on the spot and can interfere with the main beam (which is not internally reflected) from the optical point of view.

According to another preferred embodiment of the device of the present invention, the means for allowing the optical alignment between the source of emission and the focusing lens comprise at least two strips (preferably three) which extend from a front surface of the lens and are adapted to be mounted by interference on a support structure of the source of emission.

Besides guaranteeing the alignment and the stable coupling between source of emission and focusing lens, this embodiment allows reducing, at least partly, possible variations of the focusing point of the device caused by the thermal distortions of the source of emission and of the lens. In fact, since in this case the lens is connected to the support structure of the source of emission only by the strips, which present a certain elasticity and deformability, the changes of dimensions due to the different coefficients of thermal expansion between the support structure and the lens are balanced by the flexibility of the strips, thus reducing the risk of altering the optics of the system. This allows keeping the performance of the device reasonably constant. In addition, the connection through strips between support structure of the source of emission and lens allows minimising the risk of internal reflections before the laser beam passing through the aperture.

Also in this case, for the purpose of ensuring a greater safety and stability of the coupling between source of emission and focusing lens, the device of the invention also comprises an adhesive interposed between the support structure of the source of emission and the strips of the focusing lens. Preferably, said adhesive is a thermally conductive glue, so as to allow a better dissipation of heat.

According to another preferred embodiment of the device of the present invention, the means for allowing the optical alignment between source of emission and focusing lens comprise a substantially tubular container adapted to house the focusing lens and the source of emission. Preferably, the focusing lens comprises a reference notch intended for being positioned in alignment with a visual reference marked on the container. More preferably, the device of the invention comprises a clamping washer (which preferably is elastic and notched) adapted to lock in position the focusing lens inside the container. In this embodiment, the optical alignment between laser source and lens inside the container is obtained by taking as reference the arrangement of the pins of the laser diode and by superimposing the visual reference (for example, a notch or a line) of the container to the reference notch of the container of the laser and to a reference notch suitably provided on the lens. Thus, the alignment operations are relatively simple and fast.

More preferably, the container comprises an internal guide adapted to cooperate with an alignment slot located on the focusing lens. The presence of the guide into the container, and of the notch on the lens, allows simplifying the positioning of the lens inside the container. This allows further speeding up the alignment operations, as lower manual skills are required.

According to the preferred embodiment, the device of the present invention also comprises means for reading an optical code. In this case, the luminous signal diffused by an optical code present on the illuminated object is detected and processed so as to acquire the identification data of the object itself.

In a second aspect thereof, the present invention relates to a lens for focusing a laser beam, characterised in that it comprises coating means made of a substantially opaque material, applied on a peripheral portion of a front surface of the lens so as to allow the propagation of a central portion of the laser beam and obstruct the propagation of a surrounding portion of beam.

In a third aspect thereof, the present invention relates to an optical element for focusing a laser beam, characterised in that it comprises a focusing lens and a diaphragm having a central aperture adapted to allow the propagation of a central portion of the laser beam, and a surrounding surface adapted to obstruct the propagation of a surrounding portion of beam, the lens and the diaphragm comprising opposed front surfaces, having conjugated shape, adapted to be reciprocally coupled.

In a fourth aspect thereof, the present invention relates to an optical element for focusing a laser beam, characterised in that it comprises, in a central portion, a focusing lens adapted to allow the propagation of a central portion of the laser beam, and in its surrounding portion, means adapted to separate the central portion of the beam from a surrounding portion of beam.

The above described lens and optical elements are especially adapted to be assembled inside small-size and low-priced optical readers, thus allowing to obtain the above mentioned advantages.

In a further aspect thereof, the present invention relates to an apparatus for assembling an optical device of the above described type, characterised in that it comprises a support frame for the container and substantially automatic displacement means that are active on the source of emission to position the latter inside the container.

In a further aspect thereof, the invention also relates to a method for assembling a device of the above described type by means of the above-described apparatus, characterised in that it comprises the following steps:

inserting the focusing lens inside the container till abutment occurs;
inserting the laser diode inside the container by the displacement means;
observing the image of the spot caught by a sensor located at a fixed distance from the container, as the laser diode is inserted in the container;
stopping the displacement means of the laser diode when the image of the spot observed presents fixed dimensions and shape;
fixing the laser diode into position.

BRIEF DESCRIPTION OF THE DRAWINGS

Further features and advantages of the present invention will appear more clearly from the following detailed description of some preferred embodiments thereof, made with reference to the attached drawings. In such drawings.

DETAILED DISCUSSION OF PREFERRED EMBODIMENTS

In these figures, numeral 1 refers to an optical device for focusing a laser beam, in particular a substantially elliptic and astigmatic laser beam, according to the present invention. Device 1 is adapted to be used on a small-size low-priced optical reader (for example, a portable reader of optical codes) for the purpose of increasing the depth of field of the laser beam so as to allow reading information located at different distances and/or inclinations with respect to the reader itself.

Device 1 comprises a source of emission 2, typically a conventional semiconductor laser diode, which is adapted to emit—along an optical path of emission 90—a divergent laser beam 100, astigmatic and with a substantially elliptic profile.

Figure 9:
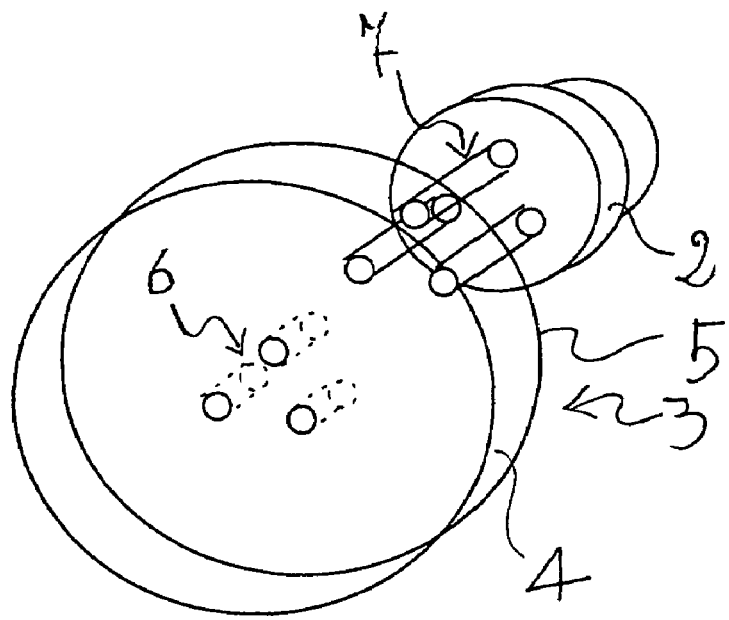
FIG. 9 shows a perspective, schematic and exploded view of the source of emission of the devices of FIGS. 1, 4 and 7.

The laser diode 2 is housed into the device 1 by means of a support structure 3; the latter essentially comprises a substantially cylindrical body 4 which is provided, on a front surface 5, with a plurality of housings 6 adapted to house respective elements 7 of electrical connection (commonly referred to as "pins") of the laser diode 2 (in particular, see FIG. 9).

Downstream of the laser diode 2, in the optical path of emission 90, the device 1 of the invention comprises a focusing lens 8 adapted to focus the laser beam 100 at a fixed reading distance.

The focusing lens 8 is usually made of a plastic material transparent to the luminous radiation; however, it is possible to use any other material that is optically transparent and that can be molded or shaped into the desired shape.

Lens 8 comprises a rear face surface 9, facing the laser diode 2 and adapted to collect the entire or a part of the laser beam 100 emitted by diode 2, and a front face surface 10 facing the opposite side of the laser diode 2 and adapted to focus the laser beam 100 at the fixed reading distance.

The rear face surface 9 of lens 8 can be plane, convex or concave so as to provide, respectively, a plano-convex lens, a biconvex lens or a positive meniscus (the term "meniscus" conventionally refers to a lens in which one surface is concave, and the other one is convex).

Means adapted to introduce diffraction in the emission laser beam 100 are directly applied on the focusing lens 8 so as to select a central portion 150 of the laser beam 100 and obstruct the propagation of the surrounding portion of beam 160. Said means define an aperture 50 on the focusing lens, and said aperture preferably has a Fresnel number smaller than 2 along a reading direction and along an orthogonal direction with respect to said reading direction; more preferably, along the reading direction the Fresnel number is smaller than 1.2.

According to a preferred embodiment of device 1, shown in FIGS. 1–4, the diffraction means comprises a coating 11 made of a substantially opaque material applied on a peripheral portion 81 of the front face surface 10 of the focusing lens 8 so as to allow the propagation only of the central portion 150 of the laser beam 100 through a corresponding central portion 82 of the lens 8 and obstructing the propagation of the surrounding portion of beam 160.

Thus, the central portion 82 of the lens 8 acts as an aperture diaphragm and allows introducing diffraction in the laser beam 100. In this way, a collimated focused and suitably truncated beam comes out of the focusing lens 8.

In a less preferred embodiment (not shown), coating 11 can alternatively be applied on the rear face surface 9 of the focusing lens 8.

The coating can be applied to the lens 8 according to any one of the following methods: spraying, sputtering, evaporation, printing, painting, etc.

According to a first alternative embodiment of device 1 of the invention, said first means comprises a diaphragm having a central aperture adapted to allow the propagation of the central portion of the laser beam and a surrounding surface adapted to obstruct the propagation of the surrounding portion of beam. In turn, the lens and the diaphragm comprise opposed front surfaces of conjugated shape, adapted to be reciprocally coupled. In this case, the device of the invention comprises an adhesive which is interposed between the diaphragm and the focusing lens for the purpose of allowing a perfect and stable coupling between the surface of the diaphragm and that of the lens.

Figure 5:
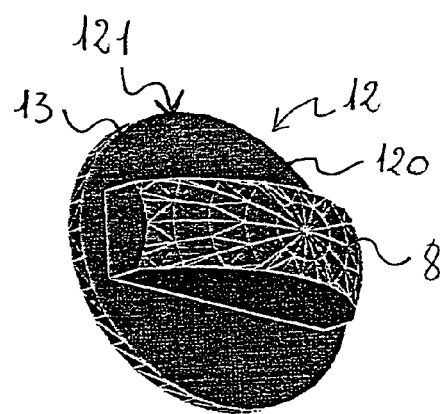
FIG. 5 shows a perspective and schematic view of an optical element according to the present invention.
Figure 6:
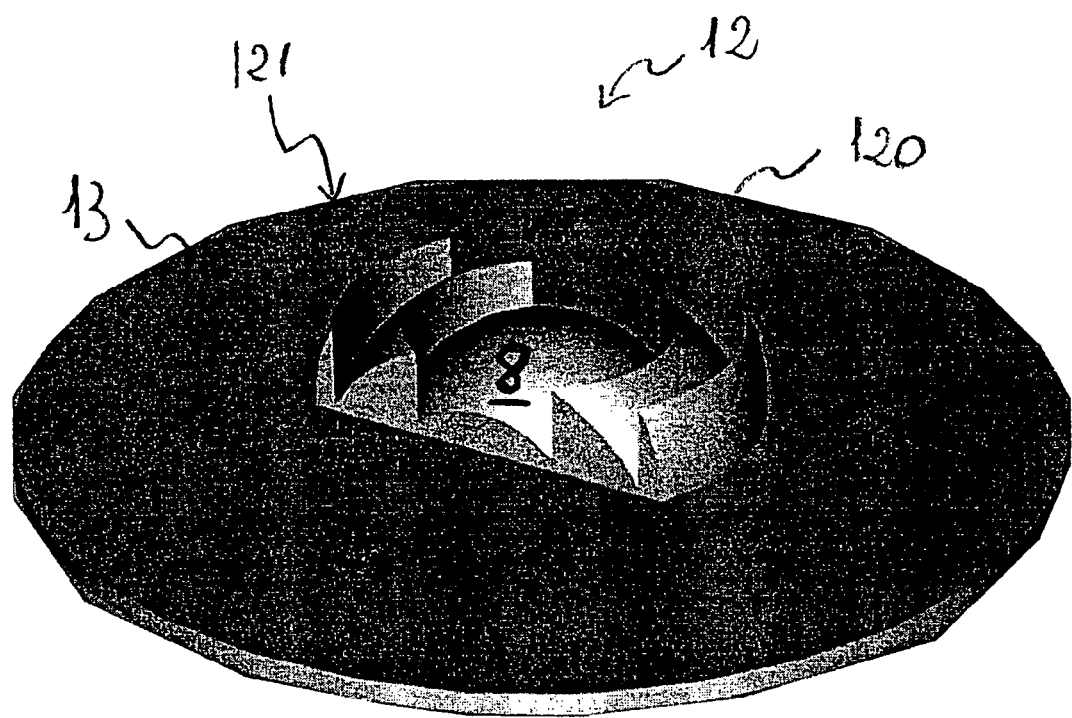
FIG. 6 shows a perspective and schematic view of a particular embodiment of the optical element in FIG. 5.

According to a second alternative embodiment of device 1 of the present invention, shown in FIGS. 5 and 6, the focusing lens 8 and the means adapted to introduce diffraction constitute a single optical element 12 comprising, in a central portion 120, the focusing lens 8 and, in a surrounding portion 121, a surface 13 of opaque material adapted to obstruct the propagation of the surrounding portion of beam.

In the embodiment shown in FIG. 6, the lens 8 is a diffractive lens made by a diffractive technology.

Alternatively, in place of the opaque surface 13 it is possible to use a diffusing surface shaped according to any one of the following types of lens: divergent Fresnel lens, refractive lens, diffractive lens, so as to disperse as much as possible the incident light on the area not used for the reading.

In this embodiment, thus, the dimensions of the focusing lens 8 are equal to those of the desired aperture, so that the entire laser beam collected by the lens 8 is focused.

Independently of the specific embodiment, in correspondence with its rear face surface 9, the focusing lens 8 comprises means adapted to allow the optical alignment between laser diode 2 and the focusing lens itself.

According to a first embodiment, shown in the figures from 1 to 3, said means comprises a substantially tubular portion 14 of lens which extends from the rear face surface 9 of the focusing lens 8 and adapted to be mounted by interference on body 4 of the support structure 3 of diode 2. The portion 14 of lens has a slightly smaller diameter with respect to that of body 4 so that the interference is quite limited (smaller than 10 μm). The portion 14 of lens, in turn, comprises an inner wall 15 which is preferably provided with three teeth, all referred to with numeral 16, extending in a substantially radial direction and adapted to be housed into corresponding housings, all referred to with numeral 17, that are peripherally obtained on body 4 of the support structure 3 of diode 2. Thus, the alignment and the stable coupling between laser diode 2 and focusing lens 8 is obtained by inserting by pressure the body 4 into the tubular portion 14 of the lens 8, so that teeth 16 are fitted into housings 17 of body 4.

For the purpose of ensuring a greater safety of the coupling between diode 2 and focusing lens 8, an adhesive is interposed between the body 4 and the tubular portion 14 of the focusing lens 8. Preferably, said adhesive is a thermally conductive glue, so as to allow a better dissipation of heat.

For the purpose of minimising the risk of internal reflections before the laser beam 100 passing through the focusing lens 8, the inner wall 15 of the substantially tubular portion 14 of lens 8 is coated with a substantially opaque material.

Figure 4:
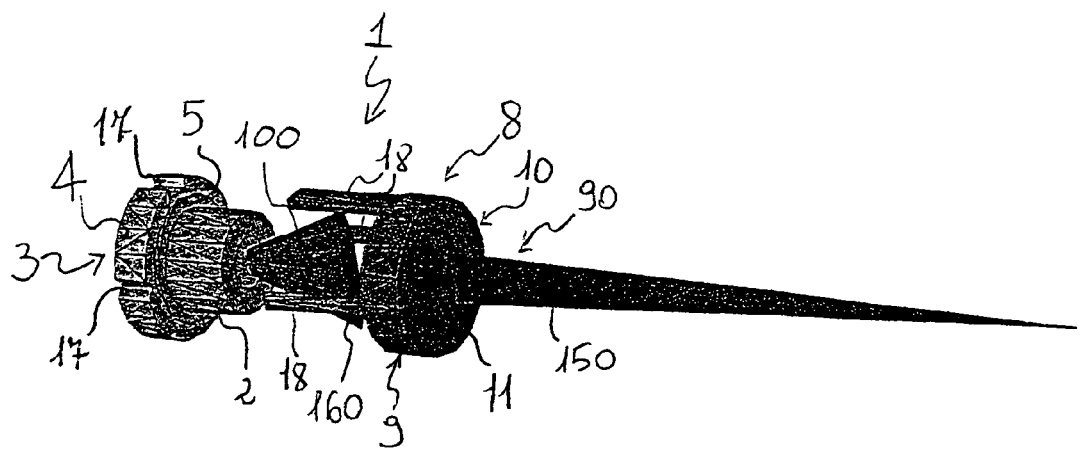
FIG. 4 shows a perspective and schematic view of a second embodiment of an optical device according to the present invention, in a practical application.

According to another preferred embodiment of device 1, shown in FIG. 4, the means for allowing the optical alignment between diode 2 and focusing lens 8 preferably comprise three strips 18 which extend from the rear face surface 9 of the lens 8 and are adapted to be mounted by interference on the housings 17 of body 4 of the support structure 3. Said strips 18 have a fixed elasticity and deformability.

Also in this case, for the purpose of ensuring a greater safety of the coupling between diode 2 and focusing lens 8 an adhesive is interposed between the strips 18 and the body 4. Preferably, also this adhesive is a thermally conductive glue.

Figure 7:
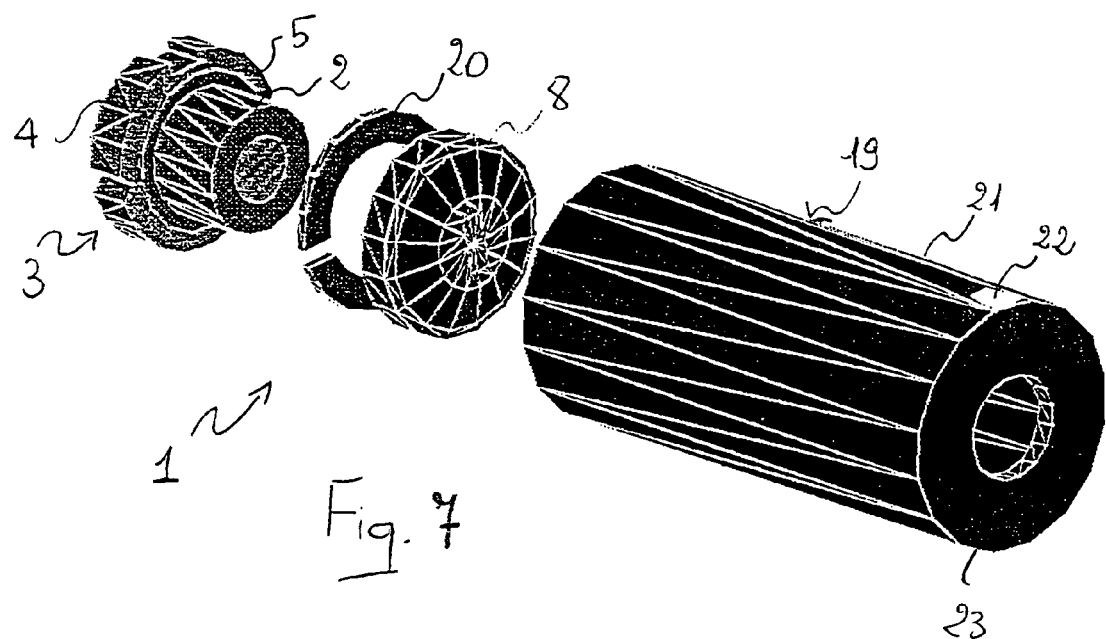
FIG. 7 shows a perspective, schematic and exploded view of a third embodiment of an optical element according to the present invention.
Figure 8:
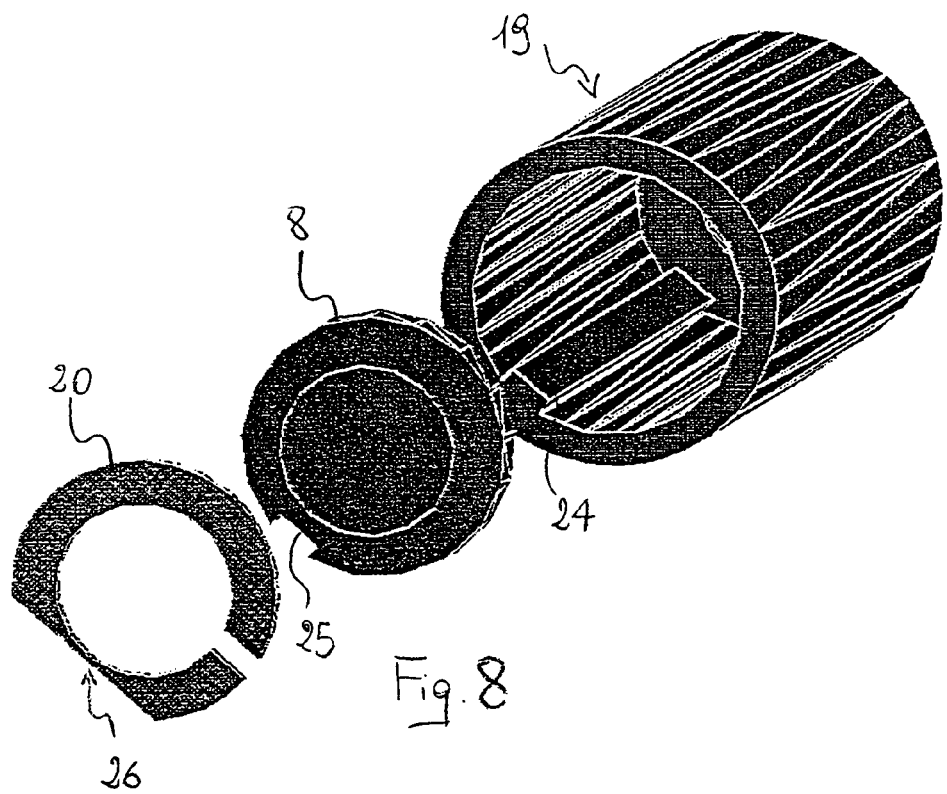
FIG. 8 shows a perspective, schematic and exploded view of a further embodiment of an optical element according to the present invention.

According to a further preferred embodiment of device 1, shown in FIGS. 7 and 8, the means for allowing the optical alignment between diode 2 and focusing lens 6 comprise a substantially tubular metal container 19 adapted to house the focusing lens 8 and the laser diode 2. Lens 8 is locked in position inside container 19 by an elastic clamping washer 20.

In the embodiment shown in FIG. 7, container 19 comprises—on an external surface 21—a visual reference 22 (for example, a notch or a line) adapted to be aligned in superimposition with a reference notch (not shown) obtained on the lens 8 and with a corresponding notch (not shown) obtained on the body 4 of the support structure 3 of the laser diode 2.

In an alternative embodiment, shown in FIG. 8, container 19 comprises an internal guide 24 adapted to cooperate with an alignment slot 25 located on the focusing lens 8. In this embodiment, the washer 20 is cut in correspondence of its portion 26 so as to be introduced inside container 19.

Container 19 also presents a perforated front surface 23 to allow the propagation of the central portion 150 of beam 100.

Figure 10:
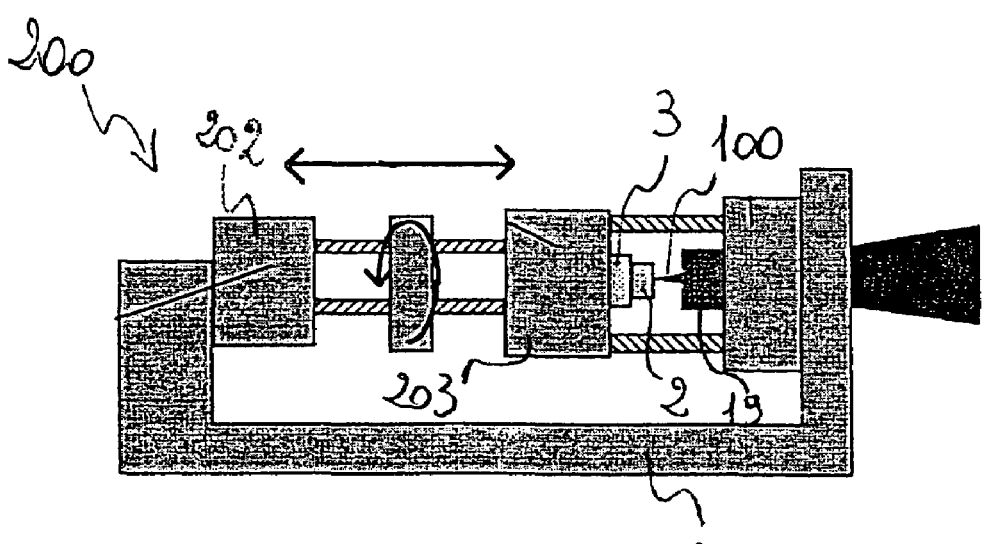
FIG. 10 shows a schematic view of equipment for assembling the device of FIGS. 7 and 8.

The device of the present invention in the particular embodiments shown in FIGS. 7 and 8 can be semi-automatically assembled by the apparatus 200 shown in FIG. 10. Said apparatus comprises a frame 201 which supports a displacement system 202 for diode 2 so as to position the latter inside container 19. Lens 8 is manually inserted into container 19 till abutment occurs; washer 20 is then pressed against lens 8, and acts as a locking spring (however, the use of a normal spring in place of washer 20 is also possible). Then, the laser diode 2 is automatically inserted (through the thrust of a piston 203); diode 2 is mounted in a fixed position with respect to body 4 of the support structure 3 so as to have always the same orientation with respect to the operator (this is ensured by taking as reference the arrangement of rheophores 7 of the laser diode 2). Diode 2 is pushed inside container 19, by observing at the same time the image of the spot caught by a CCD sensor located at a much greater (smaller) distance than that at which the spot is focused. This expedient is due to the fact that, if the dimensions and the shape of the spot are measured at much greater (or smaller) distances with respect to that of focusing, the sensitivity is greater and it is possible to detect focusing differences that cannot be detected otherwise (at both large or small distances, small differences of focusing positions correspond to great variations in the dimensions of the spot). Typically, the laser is focused at distances of 10–12 cm from the lens, whereas the spot is controlled at a distance of 50–60 cm.

When the spot at the measurement distance forms the diffraction spot having the desired dimensions and shape, the operator stops the moving device of the laser and fixes it into position.

According to the preferred embodiment, the device 1 also comprises means for reading an optical code (of the conventional type) so as to acquire identification data of an illuminated object. In particular, said means comprises an analogue/digital converter and a decoder (both of the conventional type ad thus not shown nor described here).

Figure 1:
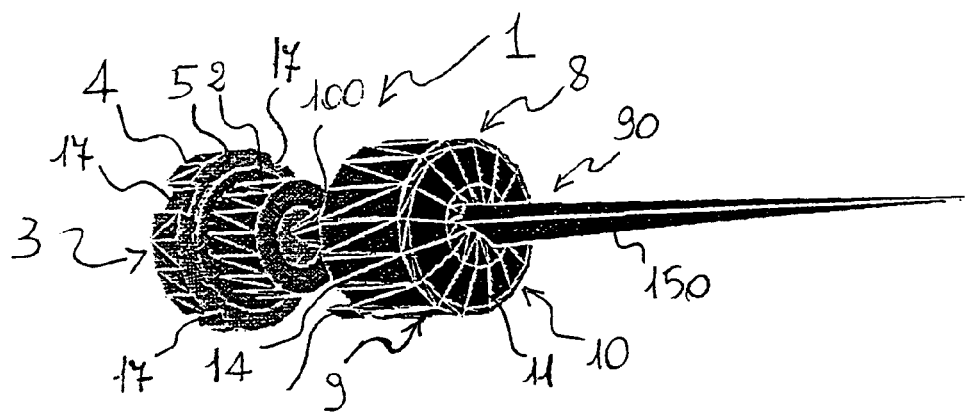
FIG. 1 shows a schematic and perspective view of a first embodiment of an optical device according to the present invention, in a practical application.
Figure 2:
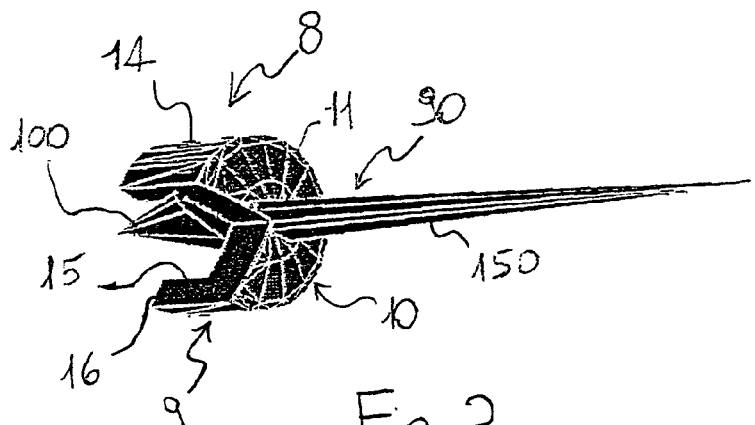
FIG. 2 shows a perspective, schematic and broken view of the focusing lens of the device in FIG. 1.
Figure 3:
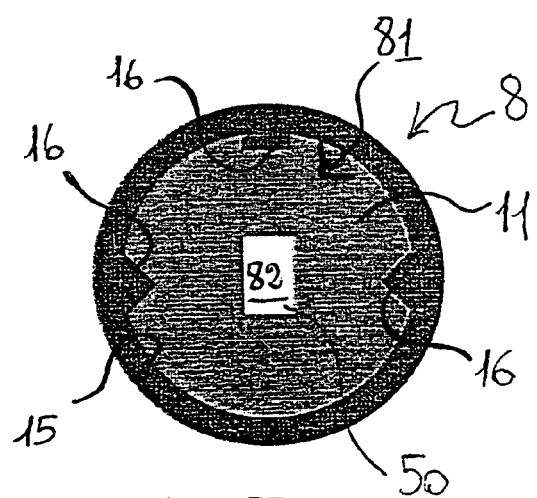
FIG. 3 shows a front schematic view of the lens in FIG. 2.

During operation, with particular reference to FIG. 1, the semiconductor laser diode 2 generates an elliptic divergent laser beam 100 which is collected by the focusing lens 8, from which a beam 150 focused on a desired reading area (in which for example, there is an object to be identified) and properly diaphragmmed, comes out. When the device is used on an optical reader, the signal diffused by the object is detected by photodetecting means present inside the reader itself and, afterwards, it is processed so as to acquire the desired information. In the specific case of a reader of optical codes, the signal detected is first converted into digital signal and then, is decoded.

What is claimed is:

1. Optical device for focusing a laser beam, said device being adapted to be used with a device for reading an optical code by means of said laser beam along at least one fixed reading direction, the optical device comprising:
    a focusing lens upon which the laser beam is directed; and
    first means for selecting only a central portion of the laser beam;
    wherein said first means is directly and integrally applied on the focusing lens and defines on the focusing lens an aperture having a Fresnel number which is smaller than 2 along said fixed reading direction,
    wherein said first means comprises a diaphragm having a central aperture adapted to allow propagation of the central portion of the laser beam, and a surrounding surface adapted to obstruct the propagation of a surrounding portion of the beam, the lens and the diaphragm comprising opposed front surfaces, of conjugate shape, adapted to be reciprocally coupled.

2. Device according to claim 1, wherein the laser beam is a substantially elliptic and astigmatic beam.

3. Device according to claim 1, wherein said aperture has a Fresnel number smaller than 1.2 along said reading direction.

4. Device according to claim 1, wherein said aperture has a Fresnel number smaller than 2 along an orthogonal direction with respect to said reading direction.

5. Device according to claim 1, wherein said first means comprises a coating of a substantially opaque material, applied on a peripheral portion of a front surface of the focusing lens so as to allow the propagation of the central portion of the laser beam, and obstruct the propagation of a surrounding portion of beam.

6. Device according to claim 5, wherein said coating is applied on the front surface of the focusing lens faced on the opposed side with respect to a source of emission of said laser beam.

7. Device according to claim 5, wherein said coating is applied according to at least one of the following methods: spraying, sputtering, evaporation, printing, painting.

8. Device according to claim 1, further comprising an adhesive which is interposed between the diaphragm and the focusing lens.

9. Device according to claim 1, wherein the focusing lens and said first means constitute a single optical element comprising, in a central portion, the focusing lens and, in a surrounding portion, means adapted to separate the central portion of the beam from the surrounding portion of beam.

10. Device according to claim 9, wherein said focusing lens is a diffracting lens made by a diffracting technology.

11. Device according to claim 9, wherein said means adapted to separate the central portion of the beam from the surrounding portion of beam comprises a surface made of a substantially opaque material, which is adapted to obstruct the propagation of the surrounding portion of beam.

12. Device according to claim 9, wherein said means adapted to separate the central portion of beam from the surrounding portion of beam comprises a surface made of a diffusing material, adapted to disperse the surrounding portion of beam.

13. Device according to claim 12, wherein the surface of diffusing material is shaped according to one of the following lenses: divergent Fresnel lens, refractive lens, diffractive lens.

14. Device according to claim 1, comprising means for allowing the optical alignment between the focusing lens and a source of emission of said laser beam.

15. Device according to claim 14, wherein the means for allowing the optical alignment between the source of emission and focusing lens comprise a substantially tubular container adapted to house the focusing lens and the source of emission.

16. Device according to claim 1, further comprising means for reading an optical code.

17. Optical device for focusing a laser beam, said device comprising:
    a focusing lens upon which the laser beam is directed;
    means for allowing the optical alignment between the focusing lens and a source of emission of said laser beam; and
    first means for selecting only a central portion of the laser beam;
    wherein said first means is directly applied on the focusing lens and defines on the focusing lens an aperture;
    wherein the means for allowing the optical alignment between the source of emission and the focusing lens comprises a substantially tubular portion of lens which extends from a front surface of the focusing lens and is adapted to be mounted by interference on a support structure of the source of emission, said substantially tubular portion comprising an inner wall provided with at least one tooth extended in a substantially radial direction and adapted to be housed into a corresponding housing obtained on the support structure of the source of emission.

18. Device according to claim 17, further comprising an adhesive interposed between the support structure of the source of emission and the substantially tubular portion of the focusing lens.

19. Device according to claim 18, wherein said adhesive is a thermally conductive glue.

20. Device according to claim 17, wherein the inner wall of the substantially tubular portion of the lens is coated with a substantially opaque material.

21. Optical device for focusing a laser beam, said device comprising:
    a focusing lens upon which the laser beam is directed;
    means for allowing the optical alignment between the focusing lens and a source of emission of said laser beam; and
    first means for selecting only a central portion of the laser beam;
    wherein said first means is directly applied on the focusing lens and defines on the focusing lens an aperture;
    wherein the means for allowing the optical alignment between the source of emission and the focusing lens comprises at least two strips which extend from a front surface of the lens and are adapted to be mounted by interference on a support structure of the source of emission.

22. Optical device for focusing a laser beam, said device comprising:
    a focusing lens upon which the laser beam is directed;

means for allowing the optical alignment between the focusing lens and a source of emission of said laser beam; and first means for selecting only a central portion of the laser beam;

wherein said first means is directly applied on the focusing lens and defines on the focusing lens an aperture;

wherein the means for allowing the optical alignment between the source of emission and the focusing lens comprise a substantially tubular container adapted to house the focusing lens and the source of emission; and wherein the focusing lens comprises a reference notch intended for being positioned in alignment with a visual reference marked on the container.

23. Device according to claim 22, further comprising a clamping washer adapted to lock the focusing lens in position inside the container.

24. Optical device for focusing a laser beam, said device comprising:

a focusing lens upon which the laser beam is directed;

means for allowing the optical alignment between the focusing lens and a source of emission of said laser beam; and first means for selecting only a central portion of the laser beam;

wherein said first means is directly applied on the focusing lens and defines on the focusing lens an aperture;

wherein the means for allowing the optical alignment between the source of emission and the focusing lens comprise a substantially tubular container adapted to house the focusing lens and the source of emission; and wherein the container comprises an internal guide adapted to cooperate with an alignment slot formed on the focusing lens.

25. Optical device for focusing a laser beam, said device comprising a single optical element upon which the laser beam is directed, said single optical element comprising:

a focusing lens in a central portion of the optical element; and first means in a surrounding portion of the optical element and around an outer edge of the focusing lens, adapted to separate a central portion of the laser beam from a surrounding portion of the laser beam, said first means and said focusing lens being distinct from one another and being arranged in said single optical element such that they are never adjacent along any direction of propagation of the laser beam within the single optical element;

wherein the entire portion of the laser beam collected by the focusing lens is focused.

26. Optical device for focusing a laser beam, said device comprising a single optical element upon which the laser beam is directed, said single optical element comprising:

a focusing lens in a central portion of the optical element; and first means in a surrounding portion of the optical element and around an outer edge of the focusing lens, adapted to separate a central portion of the laser beam from a surrounding portion of the laser beam;

wherein the entire central portion of the laser beam collected by the focusing lens is focused; and wherein the device is adapted to be used with a device for reading an optical code by means of said laser beam along at least one fixed reading direction, and wherein the first means defines on the focusing lens an aperture having a Fresnel number which is smaller than 2 along the fixed reading direction.

27. Lens for focusing a laser beam adapted for use with a device for reading an optical code by means of said laser beam at least along one fixed reading direction, said lens including a coating means made of a substantially opaque material, applied on a peripheral portion of a front surface of the lens so as to allow the propagation of a central portion of the laser beam, and obstruct the propagation of a surrounding portion of beam, wherein said coating means defines on the focusing lens an aperture having a Fresnel number which is smaller than 2 along said fixed reading direction.

28. Optical element for focusing a laser beam and adapted for use with a device for reading an optical code by means of said laser beam at least along one fixed reading direction, said element comprising a focusing lens and a diaphragm having a central aperture adapted to allow the propagation of a central portion of the laser beam, and a surrounding surface adapted to obstruct the propagation of a surrounding portion of beam, the lens and the diaphragm comprising opposed front surfaces, having conjugated shape, adapted to be reciprocally coupled, wherein said diaphragm defines on the focusing lens an aperture having a Fresnel number which is smaller than 2 along said fixed reading direction.

29. Optical element for focusing a laser beam, said element being adapted to be used with a device for reading an optical code by means of said laser beam along at least one fixed reading direction, wherein said element comprises, in a central portion, a focusing lens adapted to allow the propagation of a central portion of the laser beam and, in a surrounding portion, ms adapted to separate the central portion of the beam from a surrounding portion of beam, wherein said means defines on the focusing lens an aperture having a Fresnel number which is smaller than 2 along said fixed reading direction and wherein said means is integral with said focusing lens thereby forming a single optical element.

30. Apparatus for assembling an optical device for focusing a laser beam, said optical device being adapted to be used with a device for reading an optical code by means of said laser beam along at least one fixed reading direction, the optical device comprising:

a focusing lens upon which the laser beam is directed; and first means for selecting only a central portion of the laser beam;

wherein said first means is directly and integrally applied on the focusing lens and defines on the focusing lens an aperture having a Fresnel number which is smaller than 2 along, said fixed reading direction, said optical device further comprising means for allowing optical alignment between the focusing lens and a source of emission of said laser beam, wherein the means for allowing the optical alignment between the source of emission and the focusing lens comprises a substantially tubular container adapted to house the focusing lens and the source of emission, wherein said apparatus comprises a support frame for the container and substantially automatic displacement means acting on the source of emission to position the source of emission inside the container.

31. Method for assembling an optical device adapted to be used with a device for reading an optical code by means of said laser beam along at least one fixed reading direction, the optical device comprising:

a focusing lens upon which the laser beam is directed; and first means for selecting only a central portion of the laser beam;

wherein said first means is directly and integrally applied on the focusing lens and defies on the focusing lens an aperture having a Fresnel number which is smaller than 2 along said fixed reading direction, said optical device further comprising means for allowing optical alignment between the focusing lens and a source of emission of said laser beam, wherein the means for allowing the optical alignment between the source of emission and focusing lens comprise a substanially tubular container adapted to house the focusing lens and the source of emission, said method comprising the steps;

inserting the focusing lens inside the container using displacement means;

observing an image of a spot caught by a sensor located at a fixed distance from the container, as a laser diode is inserted in the container;

stopping displacement of the laser diode when the image of the spot observed presents predetermined dimensions and shape; and fixing the laser diode into position.

32. Optical device for focusing a laser beam, said device comprising a single optical element upon which the laser beam is directed, said single optical element comprising;

a focusing lens; and first means arranged around an outer edge of the focusing lens, adapted to separate a central portion of the laser beam from a surrounding portion of the laser beam;

wherein the entire portion of the laser beam collected by the focusing lens is focused.

33. Device according to claim 32, wherein said focusing lens is a diffracting lens made by a diffracting technology.

34. Device according to claim 32, wherein said first means are made of a substantially opaque material, which is adapted to obstruct the propagation of the surrounding portion of the beam.

35. Device according to claim 32, wherein said first means are made of a diffusing material, adapted to disperse the surrounding portion of the beam.

36. Device according to claim 32, wherein the device is adapted to be used with a device for reading an optical code by means of said laser beam along at least one fixed reading direction, and wherein the fast means defines on the focusing lens an aperture having a Fresnel number which is smaller than 2 along the fixed reading direction.

37. Device according to claim 35, wherein said first means of diffusing material is selected among the following elements: divergent Fresnel lens, refractive lens, diffractive lens.

* * * * *